United States Patent
Ono et al.

(10) Patent No.: US 12,018,928 B2
(45) Date of Patent: Jun. 25, 2024

(54) FILM THICKNESS MEASUREMENT METHOD, FILM THICKNESS MEASUREMENT DEVICE, AND FILM FORMATION SYSTEM

(71) Applicant: Tokyo Electron Limited, Tokyo (JP)

(72) Inventors: Kazunaga Ono, Yamanashi (JP); Kanto Nakamura, Yamanashi (JP); Toru Kitada, Yamanashi (JP); Atsushi Gomi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 44 days.

(21) Appl. No.: 17/853,455

(22) Filed: Jun. 29, 2022

(65) Prior Publication Data

US 2023/0011226 A1    Jan. 12, 2023

(30) Foreign Application Priority Data

Jul. 7, 2021 (JP) .................................. 2021-112655

(51) Int. Cl.
*G01B 11/06* (2006.01)
*G01N 21/95* (2006.01)
*G01N 21/21* (2006.01)

(52) U.S. Cl.
CPC ..... *G01B 11/0675* (2013.01); *G01N 21/9501* (2013.01); *G01N 2021/213* (2013.01)

(58) Field of Classification Search
CPC ........... G01B 11/0675; G01N 21/9501; G01N 2021/213

USPC .......................................................... 356/62
See application file for complete search history.

(56) References Cited

U.S. PATENT DOCUMENTS

| | | | | |
|---|---|---|---|---|
| 2002/0142493 | A1* | 10/2002 | Halliyal ................ | C23C 14/547 118/712 |
| 2010/0045981 | A1* | 2/2010 | Kikuchi ............. | G01B 11/0625 702/81 |
| 2021/0285096 | A1* | 9/2021 | Shinada ................ | G01S 7/4814 |
| 2021/0293531 | A1* | 9/2021 | Umehara ........... | G01B 11/0625 |

FOREIGN PATENT DOCUMENTS

| | | | |
|---|---|---|---|
| JP | H05149720 A | | 6/1993 |
| JP | H11330185 A | | 11/1999 |
| JP | 3790628 B2 | * | 6/2006 |
| JP | 6160614 B2 | | 7/2017 |

* cited by examiner

*Primary Examiner* — Jonathan M Hansen
*Assistant Examiner* — Omar H Nixon
(74) *Attorney, Agent, or Firm* — Fenwick & West LLP

(57) ABSTRACT

There is provided a film thickness measurement method which measures a film thickness of a specific film to be measured in a multilayer film in situ in a film formation system that forms the multilayer film on a substrate, the method comprising: regarding a plurality of films located under the film to be measured as one underlayer film, measuring a film thickness of the underlayer film, and deriving an optical constant of the underlayer film by spectroscopic interferometry; and after the film to be measured is formed, deriving a film thickness of the film to be measured by spectroscopic interferometry using the film thickness and the optical constant of the underlayer film.

20 Claims, 12 Drawing Sheets

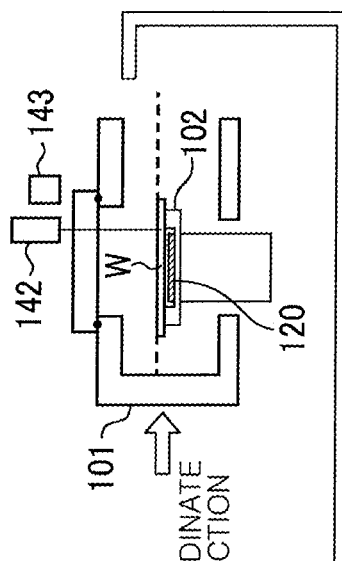
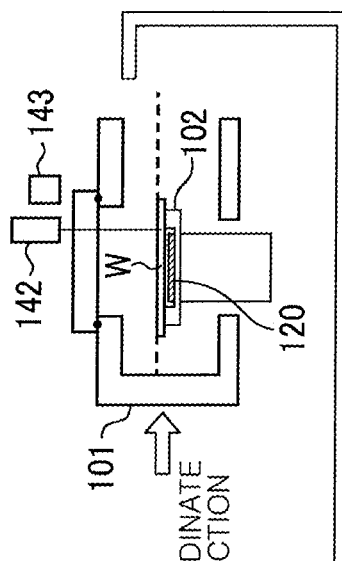
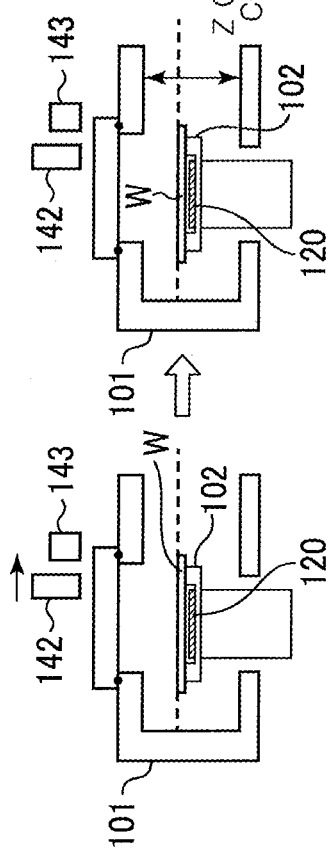
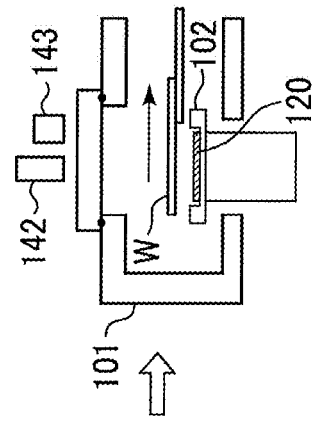
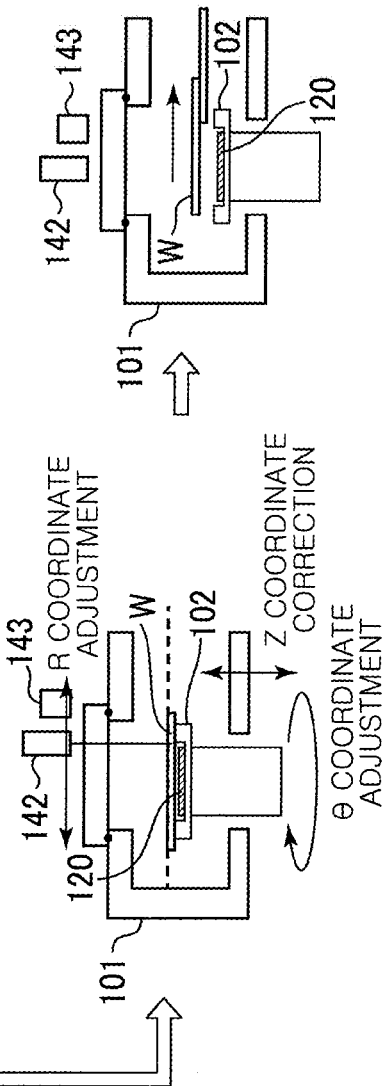

FIG. 15
| TARGET FILM THICKNESS OF CoFeB FILM [A] | SAMPLE D | SAMPLE E | SAMPLE F |
|---|---|---|---|
| | 10 | 10 | 10 |
| FILM THICKNESS DISTRIBUTION SHAPE (MAP) | 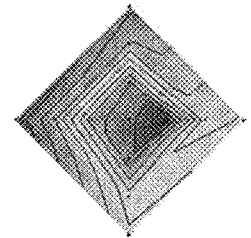 | 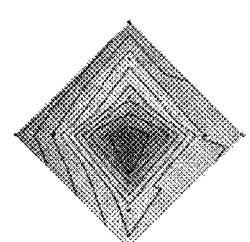 | 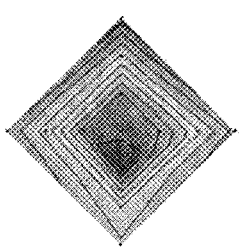 |
| AVERAGE FILM THICKNESS [A] / CV [%] | 10.6/2.66 | 10.6/2.53 | 10.6/2.71 |

FIG. 16

| | SAMPLE D | SAMPLE E | SAMPLE F |
|---|---|---|---|
| TARGET FILM THICKNESS OF CoFeB FILM [A] | 10 | 10 | 10 |
| XRF INTENSITY (Fe) DISTRIBUTION SHAPE (MAP) | | | |
| XRF INTENSITY [cps] / CV [%] | 2580/1.85 | 2576/1.65 | 2585/1.75 |

FILM THICKNESS MEASUREMENT METHOD, FILM THICKNESS MEASUREMENT DEVICE, AND FILM FORMATION SYSTEM

CROSS-REFERENCE TO RELATED APPLICATIONS

This application claims priority to Japanese Patent Application No. 2021-112655 filed on Jul. 7, 2021, the entire contents of which are incorporated herein by reference.

TECHNICAL FIELD

The present disclosure relates to a film thickness measurement method, a film thickness measurement device, and a film formation system.

BACKGROUND

For example, a device such as a magnetoresistive random access memory (MRAM) is manufactured by stacking a large number of extremely thin films. As a system for forming such stacked films, a system in which a plurality of processing modules are connected to a vacuum transfer chamber to sequentially form each film is known (for example, Japanese Patent No. 6160614).

Meanwhile, it is required to confirm whether or not the formed film has a desired film thickness, and Japanese Laid-open Patent Publication No. H5-149720 and Japanese Laid-open Patent Publication No. H11-330185 disclose a technique for measuring the formed film in situ.

SUMMARY

The present disclosure provides a film thickness measurement method, a film thickness measurement device, and a film formation system capable of measuring a film thickness of a specific film in a multilayer film in situ in a short time and with high accuracy in a film formation system for forming the multilayer film.

In accordance with an aspect of the present disclosure, there is provided a film thickness measurement method which measures a film thickness of a specific film to be measured in a multilayer film in situ in a film formation system that forms the multilayer film on a substrate, the method comprising: regarding a plurality of films located under the film to be measured as one underlayer film, measuring a film thickness of the underlayer film, and deriving an optical constant of the underlayer film by spectroscopic interferometry; and after the film to be measured is formed, deriving a film thickness of the film to be measured by spectroscopic interferometry using the film thickness and the optical constant of the underlayer film.

BRIEF DESCRIPTION OF THE DRAWINGS

FIGS. 3A to 3E are diagrams showing a procedure of actually measuring a film thickness at a film thickness measurement position.

FIG. 15 is a diagram showing a film thickness distribution shape (map), an average film thickness, and a coefficient of variation (CV) when the film thickness is derived in situ by fitting by spectroscopic interferometry in three wafer samples after a dielectric film and a magnetic film to be measured are formed on the underlayer film.

FIG. 16 is a diagram showing an X-ray fluorescence (XRF) intensity distribution shape (map), an average value of XRF intensity, and a coefficient of variation (CV) when the film thickness is measured in ex-situ by XRF in three wafer samples after a dielectric film and a magnetic film to be measured are formed on the underlayer film.

DETAILED DESCRIPTION

Hereinafter, embodiments of the present invention will be described with reference to the accompanying drawings.

<Film Formation System>

Figure 1:
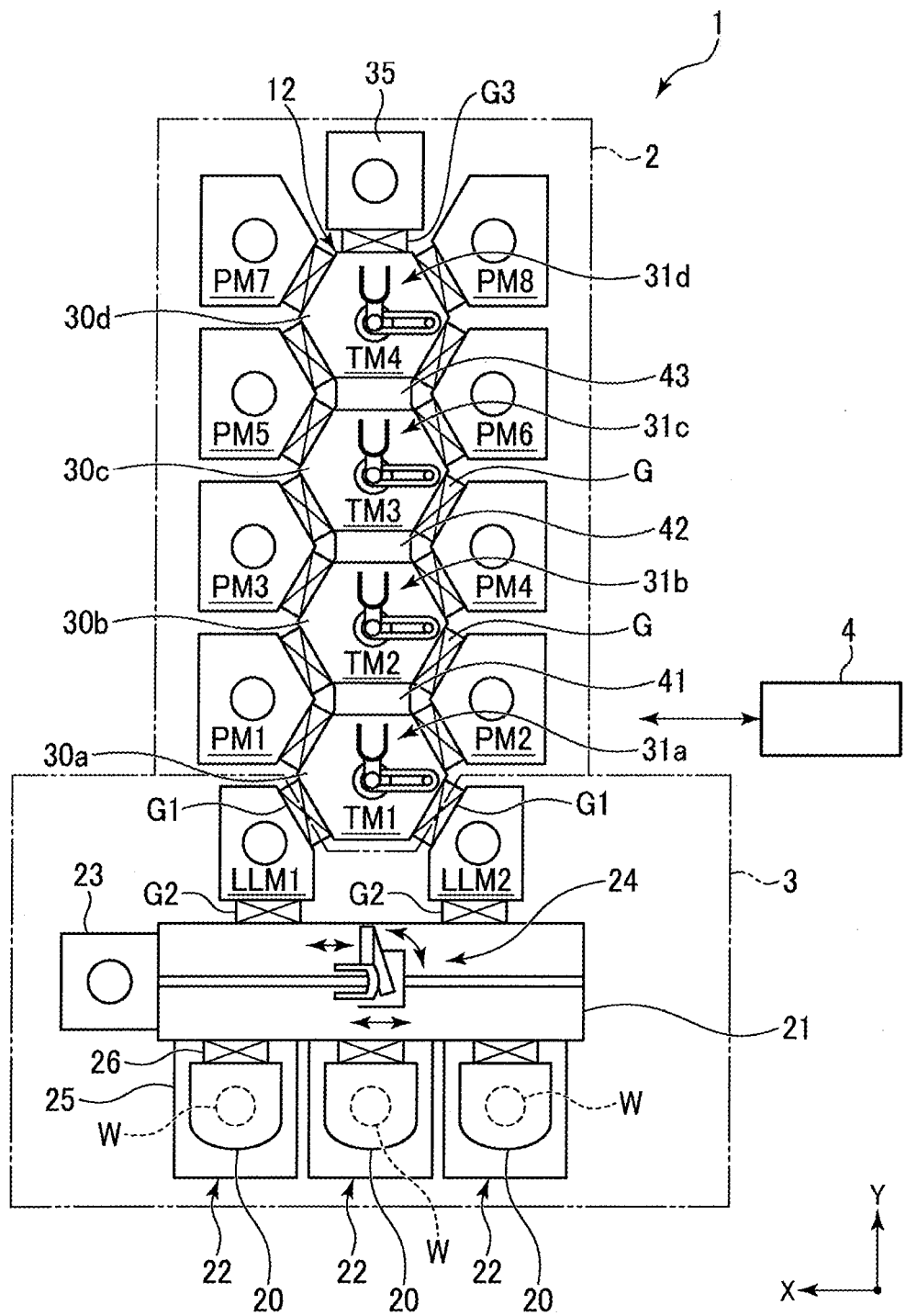
FIG. 1 is a plan view schematically showing an example of a film formation system equipped with a film thickness measurement device.

FIG. 1 is a plan view schematically showing an example of a film formation system equipped with a film thickness measurement device.

The film formation system 1 includes a processing part 2 that performs a plurality of processes including a process of forming a magnetic film, a loading and unloading part 3 that holds a plurality of substrates and loads and unloads the substrates into/from the processing part 2, and a controller 4. The substrate is not particularly limited, but is, for example, a semiconductor wafer (hereinafter, simply referred to as a wafer).

The processing part 2 includes a plurality of (8 in this example) processing modules PM1 to PM8 that perform film formation processing or the like on a substrate W, a transfer part 12 having a plurality of transfer modules TM1 to TM4 that sequentially transfer the substrates W to the plurality of processing modules PM1 to PM8, and a film thickness measurement device 35 that measures a film thickness of a formed film.

The processing modules PM1 to PM8 are modules that mainly perform film formation processing such as sputtering on the substrate W, and perform film formation processing in each of the processing modules to form a multilayer film on the substrate W. A plurality of films may be formed by one processing module. For example, in a case in which a film is formed by sputtering, a plurality of films can be formed by providing a plurality of targets in the processing module. Some of the processing modules PM1 to PM8 may perform processing other than the film formation, such as cleaning processing, preprocessing, cooling processing, and the like. In the processing modules PM1 to PM8, processing in a vacuum is performed. Here, an example of eight processing modules is shown, but the number is not limited thereto, and the required number may be set according to the number of stacked multilayer films.

The transfer modules TM1 to TM4 respectively include containers 30a, 30b, 30c, and 30d having a hexagonal plane shape maintained in a vacuum, and transfer mechanisms 31a, 31b, 31c, and 31d respectively provided in the containers 30a, 30b, 30c, and 30d. Each of delivery parts 41, 42, and 43 serving as transfer buffers is provided between the transfer mechanisms of the transfer modules TM1 to TM4. The containers 30a, 30b, 30c, and 30d of the transfer modules TM1 to TM4 communicate with each other.

In the transfer part 12, the plurality of transfer modules TM1 to TM4 are arranged in a row in a Y direction in the drawing, and four processing modules among the eight processing modules PM1 to PM8 are connected to each of two sides of the transfer part 12 via gate valves G that can be opened and closed. The gate valves G of the processing modules PM1 to PM8 are opened when the transfer mechanism of the transfer module accesses the processing module, and are closed when the processing is performed. Further, the film thickness measurement device 35 is connected to a front end portion of the container 30d of the transfer part 12 via a gate valve G3.

The loading and unloading part 3 is connected to one end side of the processing part 2. The loading and unloading part 3 includes an atmospheric transfer chamber (equipment front end module (EFEM)) 21, three load ports 22 connected to the atmospheric transfer chamber 21, an aligner module 23, two load lock modules LLM1 and LLM2, and a transfer device 24 provided in the atmospheric transfer chamber 21.

The atmospheric transfer chamber 21 has a rectangular parallelepiped shape in which an X direction in the drawing is a longitudinal direction thereof. The three load ports 22 are provided on a long side wall portion on the side of the atmospheric transfer chamber 21 opposite to the processing part 2. Each of the load ports 22 has a mounting table 25 and a transfer port 26, and a front opening unified pod (FOUP) 20, which is a container for accommodating a plurality of substrates, is mounted on the mounting table 25, and the FOUP 20 on the mounting table 25 is connected to the atmospheric transfer chamber 21 in a sealed state via the transfer port 26.

The aligner module 23 is connected to one short side wall portion of the atmospheric transfer chamber 21. In the aligner module 23, alignment of the substrate W is performed.

The two load lock modules LLM1 and LLM2 are for enabling the transfer of the substrate W between the atmospheric transfer chamber 21 having an atmospheric pressure and the transfer part 12 having a vacuum atmosphere, and the pressure thereof is variable between the atmospheric pressure and a vacuum similar to that in the transfer part 12. Each of the two load lock modules LLM1 and LLM2 has two transfer ports of which one transfer port is connected to the long side wall portion of the atmospheric transfer chamber 21 on the processing part 2 side via a gate valve G2 and the other transfer port is connected to the container 30a of the transfer part 12 in the processing part 2 via a gate valve G1.

The load lock module LLM1 is used when the substrate W is transferred from the loading and unloading part 3 to the processing part 2, and the load lock module LLM2 is used when the substrate W is transferred from the processing part 2 to the loading and unloading part 3. Also, processing such as degas processing may be performed in the load lock modules LLM1 and LLM2.

The transfer device 24 in the atmospheric transfer chamber 21 has an articulated structure and transfers the substrate W to the FOUP 20 on the load port 22 and the load lock modules LLM1 and LLM2. Specifically, the transfer device 24 takes out an unprocessed substrate W from the FOUP 20 of the load port 22 and transfers the substrate W to the load lock module LLM1. Further, the transfer device 24 receives the processed substrate W transferred from the processing part 2 to the load lock module LLM2 and transfers the substrate W to the FOUP 20 of the load port 22. FIG. 1 shows an example in which one pick receives the substrate W of the transfer device 24, but even two picks are fine.

In the processing part 2, the processing modules PM1, PM3, PM5, and PM7 are disposed on one side of the transfer part 12 in order from the load lock module LLM1 side, and the processing modules PM2, PM4, PM6, and PM8 are disposed on the other side of the transfer part 12 in order from the load lock module LLM2 side. Further, in the transfer part 12, the transfer modules TM1, TM2, TM3, and TM4 are disposed in order from the load lock modules LLM1 and LLM2 side.

The transfer mechanism 31a of the transfer module TM1 may access the load lock modules LLM1 and LLM2, the processing modules PM1 and PM2, and the delivery part 41. The transfer mechanism 31b of the transfer module TM2 may access the processing modules PM1, PM2, PM3, and PM4, and the delivery parts 41 and 42. The transfer mechanism 31c of the transfer module TM3 may access the processing modules PM3, PM4, PM5, and PM6, and the delivery parts 42 and 43. The transfer mechanism 31d of the transfer module TM4 may access the processing modules PM5, PM6, PM7, and PM8, the delivery part 43, and the film thickness measurement device 35.

The film thickness measurement device 35 measures a film thickness of a film formed by a certain processing module in situ. A position of the film thickness measurement device 35 is not limited to the position of this example. Further, the number of the film thickness measurement devices 35 may be two or more. Details of the film thickness measurement device 35 will be described below.

Since the transfer device 24 and the transfer modules TM1 to TM4 of the transfer part 12 are configured in this way, the substrates W taken out of the FOUP 20 are serially transferred in one direction along a substantially U-shaped path in the order of processing modules PM1, PM3, PM5, PM7, PM8, PM6, PM4, PM2 in the processing part 2, processed by each of the processing modules and then returned to the FOUP 20.

The controller 4 controls each component of the film formation system 1, for example, the transfer modules TM1 to TM4 (the transfer mechanisms 31a to 31d), the transfer device 24, the processing modules PM1 to PM8, the load lock modules LLM1 and LLM2, the transfer part 12, the gate valves G, G1, G2, and G3, the film thickness measurement device 35, and the like. The controller 4 is configured of a computer and includes a main controller having a central processing unit (CPU), an input device, an output device, a display device, and a memory device. A memory medium in which a processing recipe is stored is provided in the memory device. The main controller causes the film formation system 1 to perform a predetermined operation based on the processing recipe called from the memory medium. As will be described below, the main controller also calculates an optical constant of an underlayer film using a calculation model in which a plurality of films including a metal film present under a film to be measured are regarded as one underlayer film, and calculates the film thickness of the film to be measured with a calculation model using the optical constant.

In the film formation system 1 configured as described above, first, the substrate W is taken out of the FOUP 20 on the load port 22 by the transfer device 24 and is transferred to the aligner module 23. After the substrate W is aligned by the aligner module 23, the substrate W is taken out by the transfer device 24 and is transferred to the load lock module LLM1. At this time, the load lock module LLM1 has an atmospheric pressure and is evacuated after the substrate W is received.

Then, the substrate W is taken out of the load lock module LLM1 by the transfer mechanism 31a of the transfer module TM1 in the transfer part 12. The taken-out substrate W is transferred to the processing module PM1 by the transfer mechanism 31a and is subjected to a predetermined process in the processing module PM1.

After the processing in the processing module PM1 is completed, the gate valve G on the unloading side of the processing module PM1 is opened, and the substrate W is unloaded by the transfer mechanism 31b of the transfer module TM2. The unloaded substrate W is transferred to the processing module PM3 by the transfer mechanism 31b and is subjected to a predetermined process in the processing module PM3.

After the processing in the processing module PM3 is completed, the gate valve G on the unloading side of the processing module PM3 is opened, and the substrate W is unloaded by the transfer mechanism 31c of the transfer module TM3. The unloaded substrate W is transferred to the processing module PM5 by the transfer mechanism 31c and is subjected to a predetermined process in the processing module PM5.

After the processing in the processing module PM5 is completed, the gate valve G on the unloading side of the processing module PM5 is opened, and the substrate W is unloaded by the transfer mechanism 31d of the transfer module TM4. The unloaded substrate W is transferred to the processing module PM7 by the transfer mechanism 31d and is subjected to a predetermined process in the processing module PM7.

After the processing in the processing module PM7 is completed, the gate valve G of the processing module PM7 is opened, and the substrate W is unloaded by the transfer mechanism 31d of the transfer module TM4. The unloaded substrate W is transferred to the processing module PM8 by the transfer mechanism 31d and is subjected to a predetermined process in the processing module PM8.

Then, the substrate W is sequentially transferred to the processing modules PM6, PM4, and PM2 by the transfer mechanisms 31c, 31b, and 31a of the transfer modules TM3, TM2, and TM1, and predetermined processes are performed therein.

After the processing in the processing module PM2 is completed, the substrate W is transferred to the load lock module LLM2 by the transfer mechanism 31a. At this time, the load lock module LLM2 is in a vacuum state and is opened to the atmosphere after the substrate W is received. Then, the substrate W in the load lock module LLM2 is transferred into the FOUP 20 of the load port 22 by the transfer device 24.

As described above, the substrates W can be sequentially serially transferred to the plurality of processing modules in a U-shape to perform a series of film formation processing to form a multilayer film.

In the process of forming a film of such a multilayer film, a film thickness of a specific film to be measured is measured in situ by the film thickness measurement device 35, as will be described below.

<Film Thickness Measurement Device>

Next, the film thickness measurement device will be described in detail.

Figure 2:
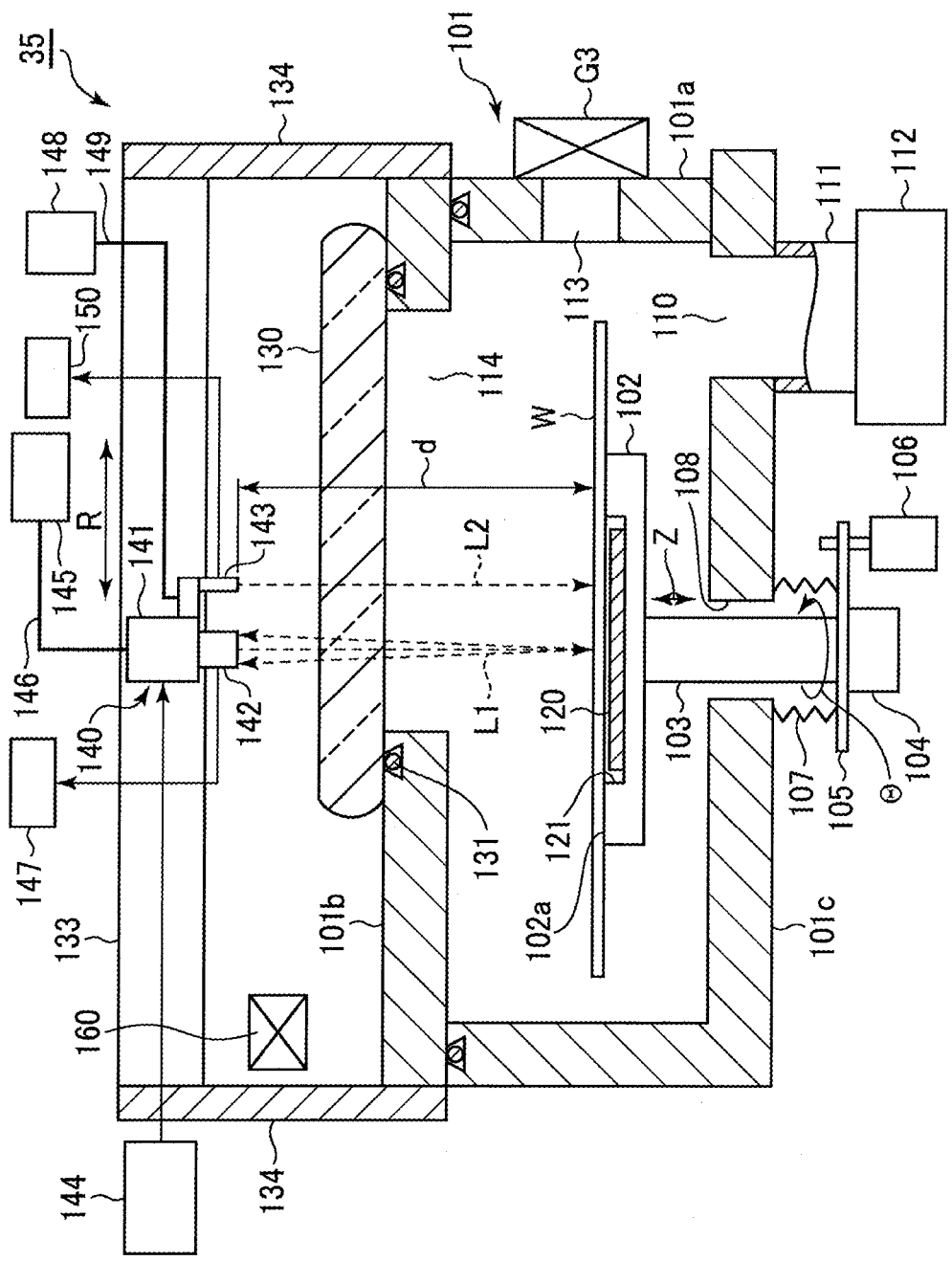
FIG. 2 is a cross-sectional view showing an example of the film thickness measurement device.

FIG. 2 is a cross-sectional view showing an example of the film thickness measurement device. As shown in FIG. 2, the film thickness measurement device 35 of this example has a chamber 101. In the chamber 101, a stage 102 on which the substrate W is mounted and which can rotate and move up and down is provided. A shaft 103 is connected to a center of a bottom surface of the stage 102. The shaft 103 extends below the chamber 101 through a through hole 108 formed in a bottom wall 101c of the chamber 101 and is connected to a rotation mechanism 104. The stage 102 is rotated by the rotation mechanism 104 via the shaft 103. The rotation mechanism 104 has a motor and an absolute encoder connected to the motor. The absolute encoder serves as an orientation detection part that detects an orientation of the stage 102, and the orientation of the stage 102 is controlled by the controller 4 based on the detection result of the absolute encoder. Further, the rotation mechanism 104 is mounted on an elevating plate 105, and an elevating mechanism 106 is connected to the elevating plate 105. The elevating mechanism 106 is configured of, for example, a piezoelectric actuator and can finely adjust a height position of the stage 102 through the elevating plate 105 and the shaft 103. An expandable and contractible bellows 107 is airtightly provided between the bottom wall 101c and the elevating plate 105 to surround the shaft 103.

An exhaust port 110 is formed in the bottom wall 101c of the chamber 101, an exhaust pipe 111 is connected to the exhaust port 110, and an exhaust mechanism 112 having a pressure control valve and a vacuum pump is connected to the exhaust pipe 111. The inside of the chamber 101 is brought into a desired vacuum state by operating the exhaust mechanism 112.

A substrate loading and unloading port 113 is provided in a side wall 101a of the chamber 101, and the substrate loading and unloading port 113 can be opened or closed by the above-described gate valve G3.

An elongated through hole 114 that extends in a diameter direction of the substrate W is formed in a top wall (a lid) 101b of the chamber 101. The through hole 114 is covered with a light transmission member 130 made of, for example, quartz through which film thickness measurement light and a laser for distance measurement, which will be described below, are transmitted. A space between the light transmission member 130 and the top wall 101b is sealed by a seal ring 131.

A recess 121 is formed in an upper surface of the stage 102, and a reference member 120 is disposed in the recess 121. The reference member 120 is made of the same material as a base portion (a base) of the substrate W, for example, silicon when the substrate W is a silicon wafer, and is used for measuring an output light amount of a light source. It is also used as a reference for film thickness measurement.

Further, an elevating pin (not shown) for transferring the substrate is provided in the stage 102 to be retractable with respect to a surface of the stage 102. A heater that heat-treats the substrate W may be provided in the stage 102.

A light emitting and receiving assembly 140 is provided in an atmospheric atmosphere region above a position corresponding to the through hole 114 of the chamber 101. The light emitting and receiving assembly 140 includes a main body 141, a measurement light emission and detection unit 142, and a laser emission and detection unit 143 for distance measurement. The measurement light emission and detection unit 142 and the laser emission and detection unit 143 for distance measurement are mounted in the main body 141 in an adjacent state. Above the chamber 101, a linear guide 133 that guides the main body 141 is horizontally disposed in a state in which the linear guide 133 is supported on the top wall 101b of the chamber 101 by a support member 134.

The main body 141 is configured as a slider guided by the linear guide 133, and the main body 141 is driven by a drive motor 144. Thus, the entire light emitting and receiving assembly 140 having the measurement light emission and detection unit 142 and the laser emission and detection unit 143 for distance measurement is configured to perform horizontal scanning along the linear guide 133. Light emitted from the measurement light emission and detection unit 142 and laser light emitted from the laser emission and detection unit 143 for distance measurement are irradiated onto the substrate W through the light transmission member 130 and the through hole 114, and an irradiation point can be scanned in the diameter direction (an R direction). Further, by rotating the substrate W on the stage 102 by the rotation mechanism 104, the irradiation points of the light emitted from the measurement light emission and detection unit 142 and the laser light emitted from the laser emission and detection unit 143 for distance measurement can be scanned in a circumferential direction (a Θ direction) on the substrate W. That is, the drive motor 144 and the rotation mechanism 104 serve as a moving mechanism for moving the irradiation points of the light emitted from the measurement light emission and detection unit 142 and the laser light emitted from the laser emission and detection unit 143 for distance measurement on the substrate.

The measurement light emission and detection unit 142 includes a light emission part that emits light L1 for film thickness measurement toward the substrate W, and a light receiving sensor that detects reflected light of the emitted light. Light is guided from a light source part 145 to the light emission part via an optical fiber 146. The light source part 145 includes a light source, an amplifier that amplifies light from the light source, an optical system, a sensor, and the like. As the light source, a lamp light source that emits short-wavelength broad-spectrum light in a visible light region having a wavelength of 200 to 800 nm can be used. A reflected light spectrum of the substrate W is measured using such a light source. It is possible to measure a film thickness of an ultrathin film having a thickness of 0.1 to 10 nm, and further, 0.3 to 3 nm with spectroscopic interferometry using such short-wavelength broad-spectrum light.

The light receiving sensor receives reflected light emitted from the light emission part and reflected by the substrate W. A detection signal detected by the light receiving sensor is transmitted to a film thickness measurement part 147, and the film thickness of the film on the substrate W is measured. The film thickness measurement part is configured of the measurement light emission and detection unit 142, the light source part 145, the optical fiber 146, and the film thickness measurement part 147.

The laser emission and detection unit 143 for distance measurement has a laser emission part that emits a laser L2 for distance measurement downward (toward the stage 102), and a light for distance measurement receiving sensor that receives reflected light of the laser. Laser light is guided from a laser light source part 148 to the laser emission part via an optical fiber 149. A detection signal detected by the light for distance measurement receiving sensor is transmitted to a distance measurement part 150, and a distance d between the light receiving sensor of the measurement light emission and detection unit 142 and the substrate W is measured. A laser distance measurement device is configured of the laser emission and detection unit 143 for distance measurement, the laser light source part 148, the optical fiber 149, and the distance measurement part 150.

A cooling fan 160 for cooling the light emitting and receiving assembly 140 is provided above the chamber 101. The cooling fan 160 is particularly effective when the stage 102 is heated by a heater.

In addition, a cover may be provided in an optical path of the measurement light emission and detection unit 142 and the laser emission and detection unit 143 for distance measurement. It is possible to prevent adverse effects on the sensor and the like due to light leakage by providing the cover.

Next, a measurement operation in the film thickness measurement device 35 configured as described above will be described.

First, the inside of the chamber 101 is maintained at the same vacuum pressure as the transfer part 12 by the exhaust mechanism 112, and the film thickness measurement part (the measurement light emission and detection unit 142) and the laser distance measurement device (the laser emission and detection unit 143 for distance measurement) are turned on. Next, the stage 102 is moved up so that a surface of the reference member 120 is aligned with a measurement surface, and the reference member 120 is irradiated with the film thickness measurement light from the light source of the light source part 145 via the measurement light emission and detection unit 142 to perform reference measurement. That is, the output light amount of the light source is measured by irradiating the reference member 120 with the light from the light source of the light source part 145, and it is confirmed whether or not the output of the light source is within a reference.

Next, a distance of a measurement point on the substrate W in a Z direction is measured. At this time, first, a reference position of the substrate W is measured. For example, when the substrate W is a wafer, notch alignment is performed. Next, a height position of the surface of the substrate W is moved to the measurement surface. Next, for a plurality of film thickness measurement positions on the substrate W, a distance to the substrate W, that is, a distance between the light receiving sensor of the measurement light emission and detection unit 142 and the irradiation point on the substrate W (a distance in the Z direction) is measured by the laser emission and detection unit 143 for distance measurement. At this time, a position in the R direction (R coordinates) of the laser emission and detection unit 143 for distance measurement is adjusted by the drive motor 144, and a position in the Θ direction (Θ coordinates) of the substrate W is adjusted by the rotation mechanism 104 so that the laser for distance measurement is sequentially irradiated onto a plurality of film thickness measurement positions.

Next, the film thickness is actually measured at the film thickness measurement position at which the distance in the Z direction is measured. FIGS. 3A to 3E are diagrams showing an operation in which the film thickness is actually measured at the film thickness measurement position at which the distance in the Z direction is measured.

First, as shown in FIG. 3A, a position of the measurement light emission and detection unit 142 is adjusted by the drive motor 144, and an angle of the substrate W is adjusted by the rotation mechanism 104. Thus, the R-Θ coordinates of the irradiation point at which the light is irradiated from the measurement light emission and detection unit 142 to the substrate W are adjusted to be one of the plurality of film thickness measurement positions. Next, as shown in FIG. 3B, the distance in the Z-direction is corrected by the elevating mechanism 106 (refer to FIG. 2) based on the measurement result of the distance (the distance in the Z direction) between the light receiving sensor and the irradiation point (thickness measurement position) by the laser distance measurement device (the laser emission and detection unit 143 for distance measurement). Next, as shown in FIG. 3C, light is irradiated from the light emission part of the film thickness measurement part (the measurement light emission and detection unit 142) onto the substrate, and the reflected light from the irradiation point (the film thickness measurement position) is detected by the light receiving sensor, the reflected light spectrum is measured, and the film thickness at the position is measured. Next, as shown in FIG. 3D, similarly, the R-Θ coordinates of the irradiation point of the light from the measurement light emission and detection unit 142 to the substrate W are sequentially adjusted to a plurality of other film thickness measurement positions, and the distance in the Z-direction of the film thickness measurement position is sequentially corrected to measure the film thickness at the plurality of other film thickness measurement positions. When the film thickness measurement at all the measurement points is completed, the substrate W is unloaded as shown in FIG. 3E.

<Film Thickness Measurement Method>

Next, an example of a film thickness measurement method in the present embodiment will be described.

In this example, in the film formation system 1 for forming a multilayer film on the substrate W, the film thickness of a specific film to be measured in the multilayer film is measured in situ by spectroscopic interferometry with the film thickness measurement device 35.

In this example, short-wavelength broad-spectrum light having a wavelength of 200 to 800 nm in a visible light region is preferably used as the measurement light so as to be suitable for measuring a film thickness of an ultrathin film having a film thickness of 0.1 to 10 nm, and further, 0.3 to 3 nm.

The multilayer film in this example is preferably a film in which ultrathin films having a thickness of 0.1 to 10 nm, and further, about 0.3 to 3 nm are stacked, and the multilayer film is, for example, a magnetic tunnel junction (MTJ) element of MRAM. The MTJ element includes a plurality of magnetic films, and a magnetic film as a free layer (an upper electrode layer) and a magnetic film as a reference layer (a lower electrode layer) are stacked with a dielectric film serving as a barrier layer (a tunnel barrier layer) interposed therebetween. A plurality of metal films such as a spacer layer and a pin layer (a magnetic film) are formed under the reference layer.

Figure 4:
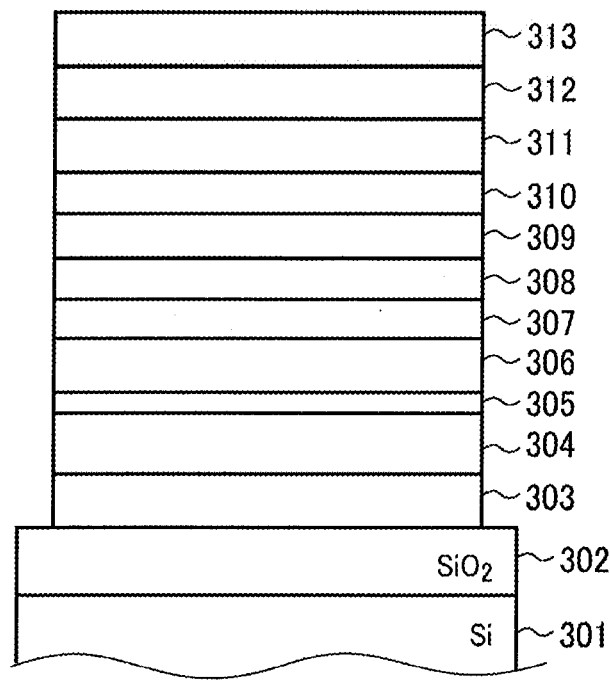
FIG. 4 is a cross-sectional view showing a specific configuration example of a magnetic tunnel junction (MTJ) element used as a multilayer film.

As a specific configuration example, as shown in FIG. 4, for example, a structure in which a plurality of metal films (the number of layers is not limited) 303 to 311, a dielectric film 312 as a barrier layer (a tunnel barrier layer), and a magnetic film 313 serving as a free layer are stacked on a substrate W in which a $SiO_2$ film 302 is formed on a Si base 301 is provided. The metal films 303 to 311 include metal films serving as a pin layer, a reference layer, and a spacer layer. The magnetic film 313, which is the uppermost free layer, is a film to be measured for measuring a film thickness in situ.

Film thickness measurement by spectroscopic interferometry utilizes interference due to multiple reflections when light is incident on a sample including a film to be measured. In order to estimate the film thickness by spectroscopic interferometry from a measured reflectance of the multilayer film sample, fitting is performed based on an equation for calculating reflectance as described below.

Hereinafter, detailed description will be given.

Figure 5:
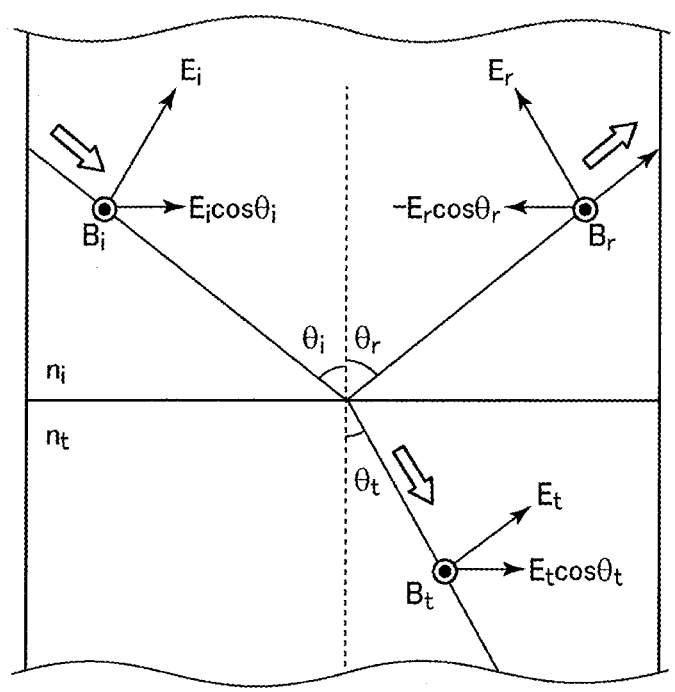
FIG. 5 is a diagram showing a state of an electromagnetic wave when light is incident on a sample.

First, as shown in FIG. 5, a case in which light is incident on a sample having a refractive index $N_t$ from a medium having a refractive index $N_i$ is considered. In FIGS. 5, E, B, and θ are an electric field, a magnetic field, and an angle, Ei, Bi, and θi are incident light, $E_t$, $B_t$, and $θ_t$ are transmitted light, and $E_r$, $B_r$, and $θ_r$ are an electric field, a magnetic field, and an angle of reflected light.

Since components of the electric field E and the magnetic field B parallel to a boundary of the medium are equal to each other on the incident side and the transmission side, the following Equations (1) and (2) are established.

$$E_i \cos θ_i - E_r \cos θ_r = E_t \cos θ_t \quad (1)$$

$$B_i + B_r = B_t \quad (2)$$

Further, assuming when c denotes the speed of light and N denotes a complex refractive index of the medium, since E=c/NB, Equation (2) becomes the following Equation (2)'.

$$N_i(E_i + E_r) = N_t E_t \quad (2)'$$

Here, assuming that $θ_i = θ_r$, from Equations (1) and (2)', an amplitude reflectance coefficient r and an amplitude transmission coefficient t are as shown in the following Equation (3) (Fresnel equation), and a measured reflectance R can be expressed by Equation (4) using the amplitude reflectance coefficient r.

[Equation 1]

$$r \equiv \frac{N_t \cos θ_i - N_i \cos θ_t}{N_t \cos θ_i + N_i \cos θ_t} = \frac{E_r}{E_i} \quad t \equiv \frac{2N_i \cos θ_i}{N_t \cos θ_i + N_i \cos θ_t} = \frac{E_t}{E_i} \quad (3)$$

$$R \equiv |r|^2 = \left|\frac{E_r}{E_i}\right|^2 \quad (4)$$

Figure 6:
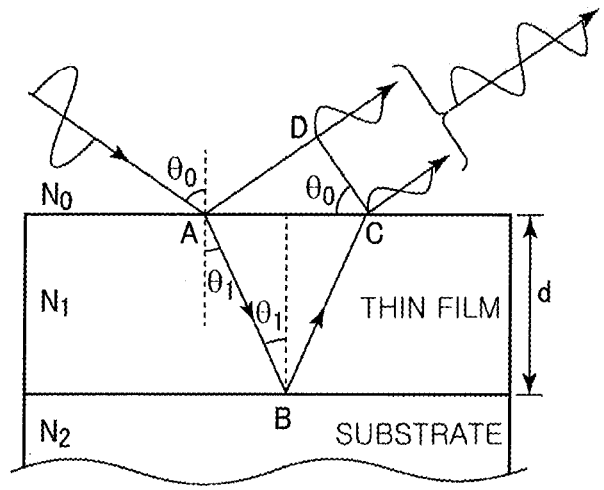
FIG. 6 is a diagram for describing optical interference in a thin film.
Figure 7:
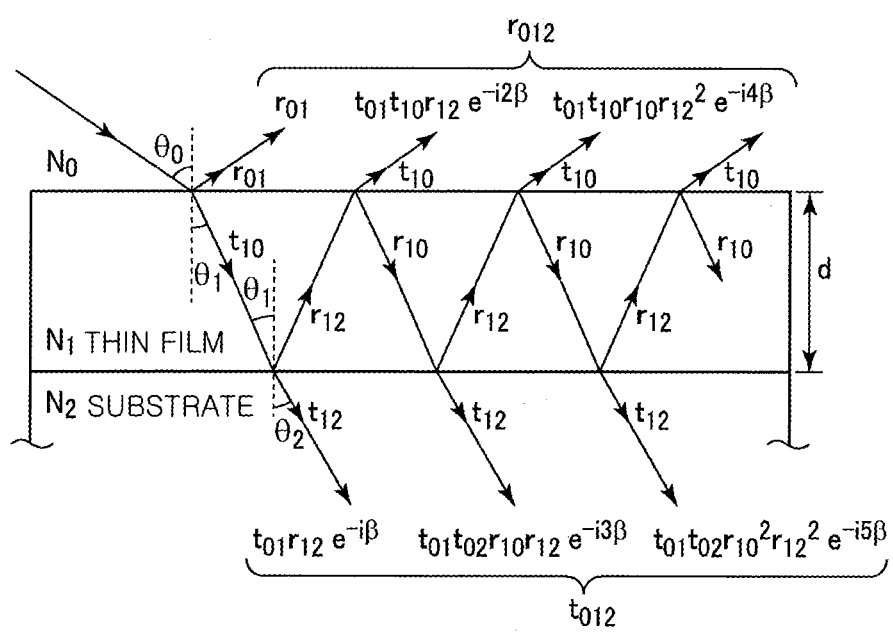
FIG. 7 is a diagram for describing multiple reflection interference in a thin film.

Next, optical reflection interference in a thin film will be considered. When light is incident on a sample as shown in FIG. 6, primary light reflected by a thin film surface A and secondary light reflected by an interface B between the thin film and the substrate overlap, and optical interference occurs. The optical interference depends on a phase difference 2β between the primary light and the secondary light, and assuming that refractive indexes of a medium, and a thin film, and a substrate are $N_0$, $N_1$, and $N_2$, a film thickness of the thin film is d, and a wavelength is λ, β is as shown in Equation (5) below. Since interference due to multiple reflections actually occurs as shown in FIG. 7, an amplitude reflectance coefficient $r_{012}$ and an amplitude transmission coefficient $t_{012}$ in the medium, the thin film, and the substrate are obtained by the following Equation (6).

[Equation 2]

$$2\beta = \frac{4\pi d N_1}{\lambda} \cos\theta_1 \qquad (5)$$

$$r_{012} = \frac{r_{01} + r_{12}\exp(-i2\beta)}{1 - r_{01}r_{12}\exp(-i2\beta)} \quad t_{012} = \frac{t_{01}t_{12}\exp(-i\beta)}{1 - r_{01}r_{12}\exp(-i2\beta)} \qquad (6)$$

Figure 8:
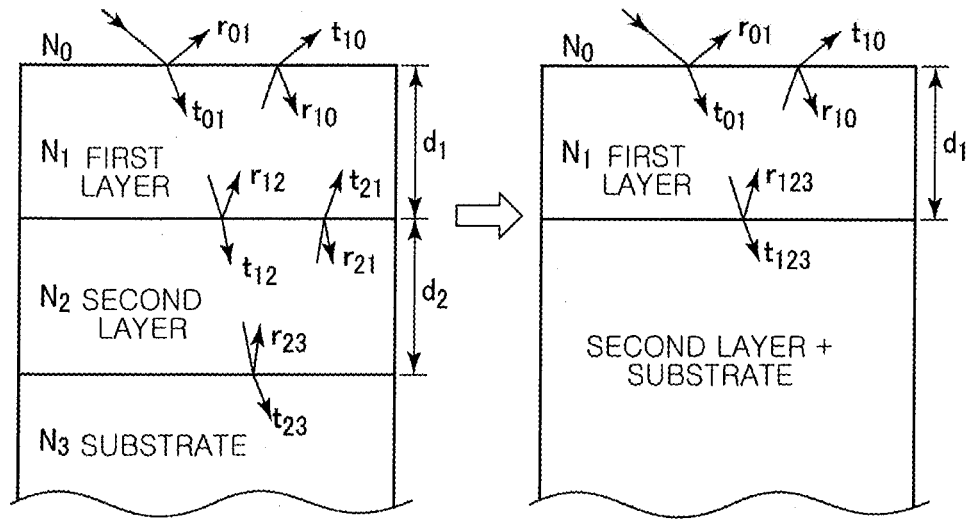
FIG. 8 is a diagram showing optical interference in a multilayer film.

Next, the optical reflection interference in the multilayer film sample will be considered. Here, the Fresnel coefficient is used. FIG. 8 shows the optical interference when a multilayer film having a two-layer structure is formed on a substrate. When the Fresnel coefficient is used, one layer is calculated at a time from the substrate toward an upper layer. First, amplitude coefficients of a second layer on the substrate side of FIG. 8 and the substrate are obtained. From the above Equation (6), an amplitude reflectance coefficient $r_{123}$ and an amplitude transmission coefficient $t_{123}$ are as shown in the following Equation (7). Then, when the amplitude reflectance coefficient $r_{123}$ and the amplitude transmission coefficient $t_{123}$ of Equation (7) are used, the overall amplitude reflectance coefficient $r_{0123}$ and amplitude transmission coefficient $t_{0123}$ are as shown in the following Equation (8).

[Equation 3]

$$r_{123} = \frac{r_{12} + r_{23}\exp(-i2\beta_2)}{1 - r_{12}r_{23}\exp(-i2\beta_2)} \quad t_{123} = \frac{t_{12}t_{23}\exp(-i\beta_2)}{1 - r_{12}r_{23}\exp(-i2\beta_2)} \qquad (7)$$

$$2\beta_2 = \frac{4\pi d_2 N_2}{\lambda} \cos\theta_2$$

$$r_{0123} = \frac{r_{01} + r_{123}\exp(-i2\beta)}{1 - r_{01}r_{123}\exp(-i2\beta)} \quad t_{0123} = \frac{t_{01}t_{123}\exp(-i\beta)}{1 - r_{01}r_{123}\exp(-i2\beta)} \qquad (8)$$

When the number of layers in the multilayer film is large, the reflectance can be calculated by repeating this procedure.

Due to the calculation based on the above Equations, the film thickness can be estimated from the reflectance of the measured multilayer film sample by spectroscopic interferometry. The calculation for estimating the film thickness from the reflectance is performed at each measurement wavelength. When there are multiple measurement wavelengths, the reflectance is calculated at each wavelength to optimize the fitting.

Figure 9:
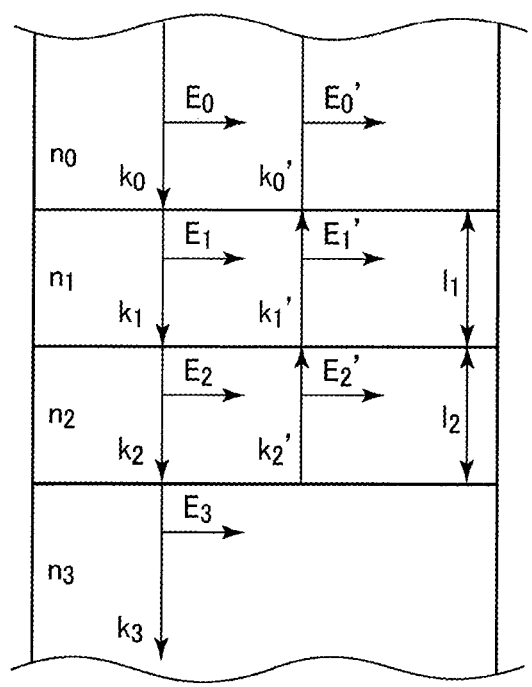
FIG. 9 is a diagram showing a state of transmission and reflection of light incident on a thin film for describing a model of a transfer matrix.

Although the method using the Fresnel coefficient in the above calculation has been described, the following method using a thin film transfer matrix may also be used. As shown in FIG. 9, when a thin film having a refractive index $n_1$ and a thickness $l_1$ is placed between media having refractive indexes $n_0$ and $n_2$, the amplitude reflectance coefficient r and the amplitude transmission coefficient t have a relationship shown in the following Equation (9). A matrix portion of Equation (9) is called a thin film transfer matrix (hereinafter, simply referred to as a transfer matrix) and is indicated by $M_i$ as shown in Equation (10). The amplitude reflectance coefficient and the amplitude transmission coefficient of a multilayer film configured of X layers can be expressed by the following Equation (11), wherein $M_i$ denotes the transfer matrix of each layer.

[Equation 4]

$$\begin{pmatrix}1\\n_0\end{pmatrix} + \begin{pmatrix}1\\-n_0\end{pmatrix}r = \begin{pmatrix}\cos k_i l_i & -\frac{i}{n_i}\sin k_i l_i \\ -in_i\sin k_i l_i & \cos k_i l_i\end{pmatrix}\begin{pmatrix}1\\n_2\end{pmatrix}t_2 \qquad (9)$$

$$M_i = \begin{pmatrix}\cos k_i l_i & -\frac{i}{n_i}\sin k_i l_i \\ -in_i\sin k_i l_i & \cos k_i l_i\end{pmatrix} \qquad (10)$$

$$\begin{pmatrix}1\\n_0\end{pmatrix} + \begin{pmatrix}1\\-n_0\end{pmatrix}r = M_1 M_2 \ldots M_x \begin{pmatrix}1\\n_{x+1}\end{pmatrix}t_{x+1} \qquad (11)$$

Here, when $M_1 M_2 \ldots M_x$ in Equation (11) is expressed as Equation (12), the amplitude reflectance coefficient r and the amplitude transmission coefficient t are obtained as the following Equation (13).

[Equation 5]

$$M_1 M_2 \ldots M_x = \begin{pmatrix}A & B\\C & D\end{pmatrix} \qquad (12)$$

$$r = \frac{An_0 + Bn_{x+1}n_0 - C - Dn_{x+1}}{An_0 + Bn_{x+1}n_0 + C + Dn_{x+1}} \quad t = \frac{2n_0}{An_0 + Bn_{x+1}n_0 + C + Dn_{x+1}} \qquad (13)$$

When the film thickness is derived from the reflectance of each of the measurement wavelengths obtained from the reflected light spectrum of the multilayer film using spectroscopic interferometry, the calculation is commonly performed by applying the sample structure to the calculation model as it is. However, in the case of a multilayer film such as an MTJ element which has an extremely thin film thickness of about 0.1 to 10 nm and is configured by stacking a large number of (for example, about 10 layers) films mainly made of metal films, when the calculation is performed by applying the structure to the calculation model as it is, the following problems will occur.

Figure 10:
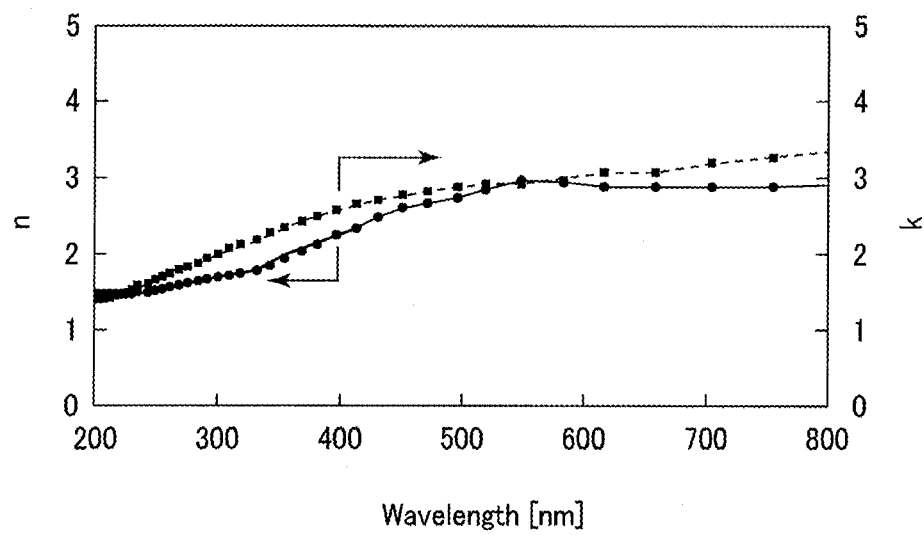
FIG. 10 is a diagram showing wavelength dependence of an optical constant of Fe measured by Johnson et al.

In the case of a metal film, the optical constant is a complex refractive index, and the complex refractive index N is expressed as N=n−ik, wherein n denotes a refractive index and k denotes an attenuation coefficient. FIG. 10 is a diagram showing the wavelength dependence of an optical constant of Fe measured by Johnson et al., and as shown in the drawing, it can be seen that Fe has n and k having different values in the visible light region. The wavelength dependence of n and k differs according to a type of metal, but a metal film has n and k. Therefore, for a multilayer film including a metal film, the calculation when the film thickness is estimated from the reflectance by spectroscopic interferometry becomes complicated as compared with the multilayer film of the dielectric film in which k=0 and only the refractive index n needs to be considered. Moreover, when the number of layers is large as in the MTJ element, it is necessary to repeat such a complicated calculation for the number of layers, and the calculation becomes more complicated.

Further, in the case of a multilayer film in which ultrathin films of about 0.1 to 10 nm are stacked, since the film thickness of each layer is much smaller than the wavelength of the measurement light of 200 to 800 nm, and a change in the reflected light spectrum is also very small, it is basically difficult to grasp the film thickness difference of each layer and to measure the film thickness. Moreover, when the film thickness of each layer is much smaller than the measurement wavelength as described above, a bulk optical constant cannot be used for the calculation, and it is necessary to estimate the optical constant of each film. This also causes the analysis to be complicated.

When the film thickness is measured in situ in the process of the film formation as in this example, from the viewpoint of a throughput of the film formation process, the time allowed for measuring the film thickness is finite. Therefore, when a structure of an actual multilayer film is used in the calculation model, it takes more time to perform the calculation, and the film thickness may not be calculated within an allowable time.

Figure 11:
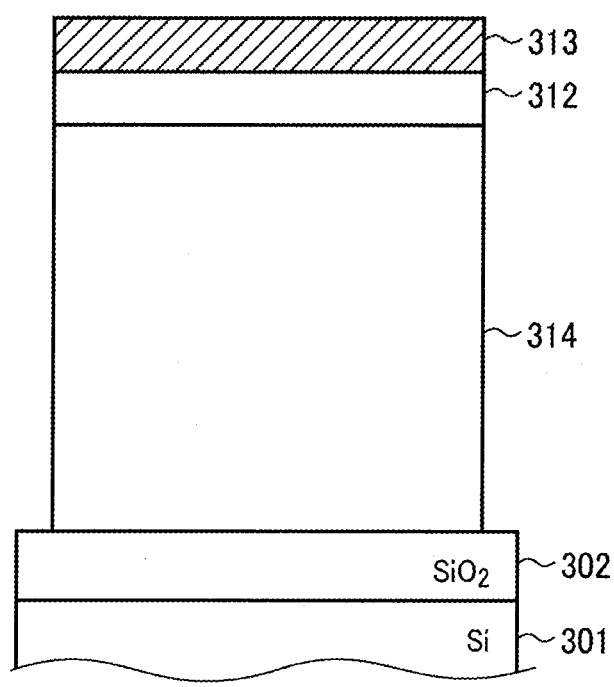
FIG. 11 is a cross-sectional view showing an example of a calculation model in a case in which the multilayer film is the MTJ element of FIG. 4.

Therefore, in this example, the film thickness of the film to be measured is measured using a calculation model in which a plurality of films located below the film to be measured for measuring the film thickness in the multilayer film are regarded as one underlayer film. For example, when the multilayer film is the MTJ element of FIG. 4, in particular, the magnetic film 313 constituting the free layer that is a film for which film thickness control is particularly important is used as the film to be measured, and as shown in FIG. 11, a calculation model in which the metal films 303 to 311 are regarded as one underlayer film 314 is used.

Figure 12:
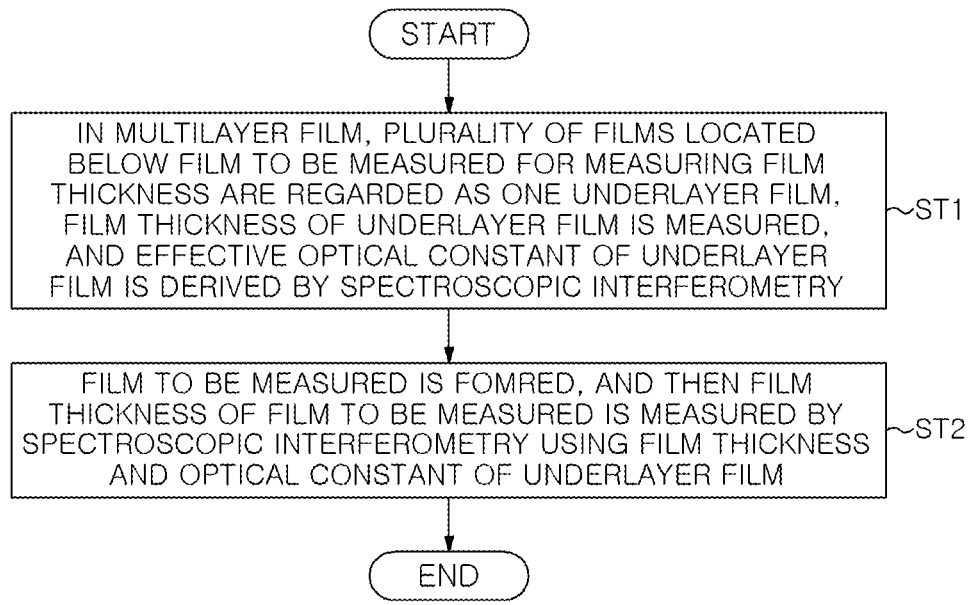
FIG. 12 is a flowchart showing an example of a film thickness measurement method.

FIG. 12 is a flowchart showing a film thickness measurement flow in this case.

First, in the multilayer film, a plurality of films located below a film to be measured for measuring the film thickness are regarded as one underlayer film, the film thickness of the underlayer film is measured, and an effective optical constant of the underlayer film is derived by spectroscopic interferometry (Step ST1).

Next, after a film to be measured is formed on the underlayer film, the film thickness of the film to be measured is measured by spectroscopic interferometry using the film thickness and the optical constant of the underlayer film (Step ST2).

Broad-spectrum light having a wavelength of 200 to 800 nm in the visible light range is suitable as the measurement light used in the spectroscopic interferometry, and a material containing a metal or a semiconductor having a large complex refractive index in this wavelength range is suitable as a material of the multilayer film because a high effect can be obtained. Thus, even when the film thickness is very thin, for example, in a range of 0.1 to 10 nm, the film thickness can be measured. Further, when the film thickness of each film constituting the multilayer film such as an MTJ element is very thin, for example, in a range of 0.1 to 10 nm, it is extremely small as compared with the wavelength of the measurement light of 200 to 800 nm. Therefore, there is no problem in regarding a plurality of films under the film to be measured as one optically homogeneous layer based on an effective medium approximation theory.

In Step ST1, the film thickness of the underlayer film can be calculated together with the optical constant by fitting using spectroscopic interferometry. Further, as the film thickness of the underlayer film, a value obtained from a film formation rate at the time of film formation may be used. When the film formation process is stable and the film thickness of the underlying film can be regarded as constant, a fixed value measured in advance may be used as the film thickness.

In the case in which the multilayer film is the MTJ element of FIG. 4 as an example, the film to be measured is the magnetic film 313 constituting a free layer which is a film for which film thickness control is particularly important, and as shown in FIG. 11, a calculation model in which the metal films 303 to 311 are regarded as one layer underlayer film 314 is used. In the example of FIG. 4, in the film thickness measurement of the magnetic film 313, the film thickness and the optical constant of the dielectric film 312 are required, and for values thereof, an optical constant and a film thickness measured in advance can be used as fixed values.

In this way, by deriving the film thickness of the film to be measured using the calculation model in which the plurality of films under the film to be measured are regarded as one underlayer, the following effects can be obtained without causing optical problems.

That is, due to the plurality of films being regarded as one underlayer film, the number of layers to be calculated becomes small (4 layers in the example of FIG. 11), and a calculation time is also shortened. In particular, when the underlayer film includes a metal film, it has a complex refractive index and the calculation becomes complicated, and thus the effect of shortening the calculation time becomes higher. In addition, since the underlayer film is sufficiently thicker than the film to be measured, and a relative difference between a reflected light spectrum of the film to be measured and a reflected light spectrum of the underlayer film becomes large, it is possible to measure a film thickness difference, which is normally difficult, and it is possible to measure the film thickness of the film to be measured with high accuracy. Therefore, the film thickness of the film to be measured can be measured in situ in a short time and with high accuracy.

<Specific Flow of Film Formation and Film Thickness Measurement in Film Formation System>

Figure 13:
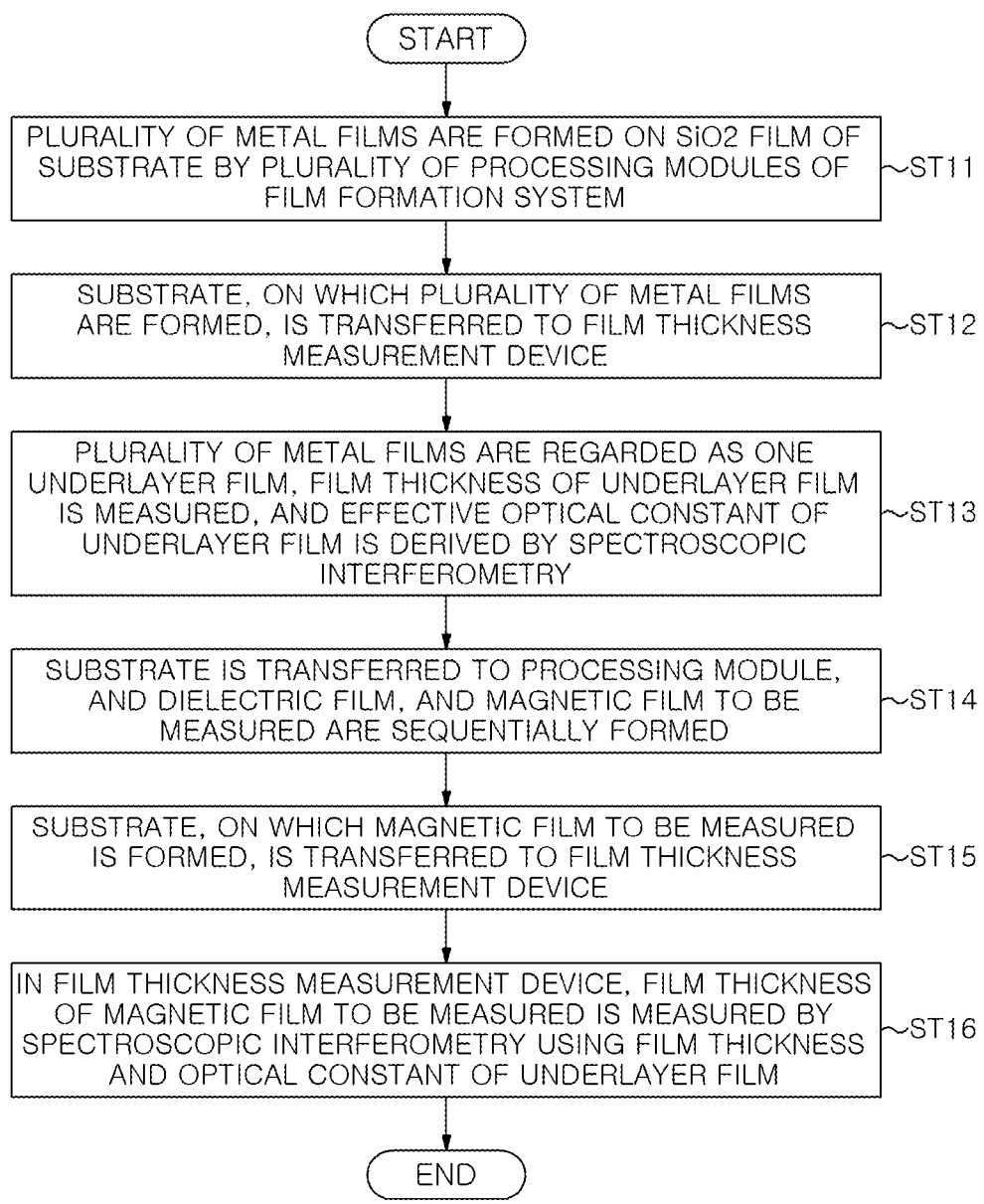
FIG. 13 is a flowchart showing a specific procedure of film formation and film thickness measurement in a film formation system.

Next, a specific flow of the film formation and the film thickness measurement in the film formation system will be described. FIG. 13 is a flowchart showing a flow at this time. The following flow is performed under control of the controller 4.

First, the metal films 303 to 311 are formed on the $SiO_2$ film 302 of the substrate W by the plurality of processing modules of the film formation system 1 (Step ST11).

Next, the substrate W on which the plurality of metal films 303 to 311 are formed is transferred to the film thickness measurement device 35 (Step ST12).

Next, in the film thickness measurement device 35, the plurality of metal films 303 to 311 are regarded as one underlayer film 314, the film thickness of the underlayer film is measured, and an effective optical constant of the underlayer film 314 is derived by spectroscopic interferometry (Step ST13). This step can be performed by irradiating the substrate W after the metal films 303 to 311 constituting the underlayer film 314 is formed with broad-spectrum light having a wavelength of 200 to 800 nm in the visible light range from the light source of the light source part 145. At this time, both the film thickness and the optical constant of the underlayer film 314 can be derived by fitting by spectroscopic interferometry. Further, the film thickness of the underlayer film 314 may be obtained from a film formation rate when the underlayer film 314 is formed. When the film formation process is stable and the film thickness of the underlayer film 314 can be regarded as constant, a fixed value measured in advance may be used as the film thickness. The film thickness and the optical constant of the underlayer film 314 obtained here are stored and held in the controller 4.

Next, the substrate W is transferred to the processing module, and the dielectric film 312 and the magnetic film 313, which is a film to be measured, are sequentially formed (Step ST14).

Then, the substrate W on which the magnetic film 313, which is the film to be measured, is formed is transferred to the film thickness measurement device 35 (Step ST15). At this time, preferably, an angle (a notch angle) of the substrate W is controlled to be kept constant based on a detection value of an absolute encoder of the rotation mechanism 104. Thus, in the film thickness measurement of an extremely thin film having a thickness of 10 nm or less, and further, 1 nm or less, it is possible to suppress a variation in the measurement result of the film thickness for each substrate due to the inclination of the stage 102.

Next, in the film thickness measurement device 35, the film thickness of the magnetic film 313, which is the film to be measured, is measured by spectroscopic interferometry using the film thickness and the optical constant of the underlayer film 314 (Step ST16). This step can be performed by irradiating the substrate W on which the film to be measured (the magnetic film 313) is formed with short-wavelength broad-spectrum light having a wavelength of 200 to 800 nm from the light source of the light source part 145. Specifically, the optical constant and the film thickness of the film to be measured can be derived by fitting by spectroscopic interferometry using the reflectance when the measurement light is irradiated thereto, the film thickness, and the optical constant of the underlayer film 314.

Due to the above flow, in the process in which the MTJ element which is a multilayer film is formed on the substrate W by the film formation system 1, the film thickness of the magnetic film 313, which is the film to be measured, can be measured in situ in a short time and with high accuracy.

Experimental Example

Next, an experimental example will be described.

Here, a case in which the film thickness of the uppermost magnetic film 313, which is the film to be measured, is measured in a 300 mm wafer (a substrate) in which the MTJ element of FIG. 4 is formed as the multilayer film will be described. A CoFeB alloy is used as the magnetic film 313, which is the film to be measured.

Figure 14:
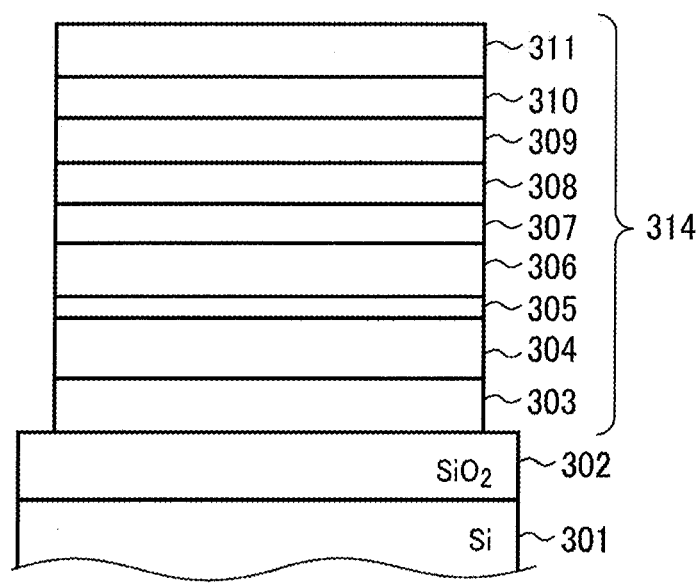
FIG. 14 is a cross-sectional view showing a substrate after a plurality of metal films constituting an underlayer film is formed.

First, regarding a wafer sample after the film formation up to the metal film 311 shown in FIG. 14 is performed, the metal films 303 to 311 were regarded as one underlayer film 314, and a film thickness, a film thickness distribution (the number of measurement points: 13 points) and an optical constant of the underlayer film 314 were derived by spectroscopic interferometry. A light source that emits short-wavelength broad-spectrum light having a wavelength of 200 to 800 nm in the visible light range was used as the light source. The formation of the metal films 303 to 311 was performed in a vacuum by the film formation system shown in FIG. 1, and the film thickness measurement and the like were performed in situ in vacuum by the film thickness measurement device provided in the film formation system. The measurement of the film thickness of the underlayer film 314 and the calculation of the optical constant were performed for three samples A to C having the same structure. As a result, in sample A, an average film thickness was 90.98 angstrom (Å) (9.098 nm), and a coefficient of variation CV was 0.42%, in sample B, the average film thickness was 90.97 Å (9.097 nm), and the coefficient of variation CV was 0.33%, and in sample C, the average film thickness was 90.93 Å (9.093 nm), and the coefficient of variation CV was 0.35%. As described above, it was confirmed that the average film thickness and the distribution were almost the same for the three samples. As for the optical constant, almost the same values were obtained for the three samples. The film thickness and the optical constant at each measurement position are used in the calculation of the film thickness of the magnetic film 313 that is a film to be measured which will be described next.

Next, regarding the wafer sample after the dielectric film 312 and the magnetic film 313 which is the film to be measured are formed on the underlayer film 314 shown in FIG. 4, the film thickness and the film thickness distribution (the number of measurement points: 13 points) of the magnetic film 313, which is the film to be measured, were derived using the spectroscopic interferometry. As a light source, broad-spectrum light having a wavelength of 200 to 800 nm, which is a visible light region, was used. The formation of the dielectric film 312 and the magnetic film 313 was performed in vacuum by the film formation system shown in FIG. 1, and the film thickness of the magnetic film 313 was measured in situ in vacuum by a film thickness measurement device provided in the film formation system. The film thickness measurement and the calculation of the optical constant were performed on three samples D to F having the same structure. The film thickness of the magnetic film 313 was derived by fitting by spectroscopic interferometry using the optical constant and the film thickness of the underlayer film 314 obtained above.

FIG. 15 is a diagram showing the film thickness distribution shape (map), the average film thickness, and the coefficient of variation (CV) at that time. As shown in the drawing, in sample D, the average film thickness was 10.6 Å (1.06 nm) and the coefficient of variation was 2.66%, in sample E, the average film thickness was 10.6 Å (1.06 nm) and the coefficient of variation was 2.53%, and in sample F, the average film thickness was 10.6 Å (1.06 nm) and the coefficient of variation is 2.71%, which were almost the same for all three samples. Further, the film thickness distribution shapes of the samples D to F were almost the same. As described above, it was confirmed that reproducibility of the film thickness and the film thickness distribution shape of the magnetic film 313, which is the film to be measured, were extremely high.

Next, regarding the above-described samples D to F having the structure of FIG. 4, the film thickness of the magnetic film 313 was measured by ex-situ X-ray fluorescent (XRF) analysis which has been conventionally performed. Here, an XRF intensity of a Fe element of CoFeB constituting the magnetic film 313 was measured. Since the XRF intensity is proportional to the number of atoms and the number of atoms is proportional to the film thickness, the film thickness can be derived from the XRF intensity, and the XRF intensity distribution can be regarded as substantially equal to the film thickness distribution.

FIG. 16 is a diagram showing the XRF intensity distribution shape (map), the average value of the XRF intensity, and the coefficient of variation (CV) at that time. As shown in the drawing, in sample D, the average value of the XRF intensity was 2580, and the coefficient of variation CV was 1.85%, in sample E, the average value of the XRF intensity was 2576, and the coefficient of variation CV was 1.65%, and in sample F, the average value of the XRF intensity was 2585 and the coefficient of variation CV was 1.75%, which were almost the same for all three samples. It was also confirmed that the converted film thickness was almost the same as when spectroscopic interferometry was used. Further, the XRF intensity distribution shapes of the samples D to F were almost the same as the film thickness distribution shape when spectroscopic interferometry was used.

From this, it was confirmed that the film thickness of the magnetic film 313, which is the film to be measured, can be measured with the same accuracy as the film thickness measurement using conventional XRF by regarding the metal films 303 to 311 as a one layer underlayer film 314 and performing the film thickness measurement in situ using spectroscopic interferometry.

OTHER APPLICATIONS

Although the embodiments have been described above, the embodiments disclosed here should be considered to be exemplary in all respects and not restrictive. The above embodiments may be omitted, replaced or modified in various forms without departing from the scope of the appended claims and the gist thereof.

For example, in the above embodiment, the case in which the film to be measured is one has been shown, but the film to be measured may be two or more. Further, the MTJ element used for the MRAM is exemplified as the multilayer film, and the case in which the magnetic film, which is the uppermost free layer, is used as the film to be measured has been shown, but the present invention is not limited thereto.

Further, although the system in which the substrate is sequentially transferred to the plurality of processing modules for processing has been described as the film formation system in the above embodiment, the present invention is not limited thereto, and the substrate may be randomly transferred to a plurality of processing modules.

Furthermore, an installation position of the film thickness measurement device is not limited to the position of the embodiment and may be provided in the transfer module or in the transfer part between adjacent transfer modules. Further, the moving mechanism for moving a position in which the substrate is irradiated with the light for measuring the film thickness is not limited to that of the above embodiment.

The invention claimed is:

1. A film thickness measurement method for measuring a film thickness of a specific film to be measured in a multilayer film in situ in a film formation system that forms the multilayer film on a substrate, the method comprising:
   regarding a plurality of films located under the film to be measured as one underlayer film, measuring a film thickness of the underlayer film, and deriving an optical constant of the underlayer film by spectroscopic interferometry; and
   after the film to be measured is formed, deriving a film thickness of the film to be measured by spectroscopic interferometry using the film thickness and the optical constant of the underlayer film.

2. The film thickness measurement method of claim 1, wherein measurement light used in the spectroscopic interferometry is broad-spectrum light having a wavelength of 200 to 800 nm in a visible light range.

3. The film thickness measurement method of claim 2, wherein the multilayer film includes a metal film.

4. The film thickness measurement method of claim 3, wherein a film thickness of each film in the multilayer film is in a range of 0.1 to 10 nm.

5. The film thickness measurement method of claim 2, wherein the film thickness of the underlayer film is derived together when the optical constant of the underlayer film is derived by spectroscopic interferometry.

6. The film thickness measurement method of claim 2, wherein a value obtained from a film formation rate when a film constituting the underlayer film is formed, or a fixed value measured in advance is used as the film thickness of the underlayer film.

7. The film thickness measurement method of claim 1, wherein the film thickness of the underlayer film is derived together when the optical constant of the underlayer film is derived by spectroscopic interferometry.

8. The film thickness measurement method of claim 1, wherein a value obtained from a film formation rate when a film constituting the underlayer film is formed, or a fixed value measured in advance is used as the film thickness of the underlayer film.

9. A film thickness measurement device which measures a film thickness of a specific film to be measured in a multilayer film in situ in a film formation system, the system including a processing module for forming a film on a substrate and a transfer module for transferring the substrate to the processing module to form the multilayer film, the device comprising:
   a stage on which the substrate is mounted;
   a measurement light emission and detection unit including a light emission part configured to emit measurement light for film thickness measurement toward the substrate on the stage and a light receiving sensor configured to receive reflected light due to the measurement light being reflected by the substrate;
   a moving mechanism configured to move an irradiation point of the measurement light on the substrate; and
   a controller,
   wherein the controller performs:
   mounting the substrate, after a plurality of films located under a film to be measured are formed, on the stage, regarding the plurality of films as one underlayer film, measuring a film thickness of the underlayer film, and deriving an optical constant of the underlayer film by spectroscopic interferometry, and
   mounting the substrate, after the film to be measured is formed, on the stage, and deriving a film thickness of the film to be measured by spectroscopic interferometry using the film thickness and the optical constant of the underlayer film.

10. The film thickness measurement device of claim 9, wherein measurement light used in the spectroscopic interferometry is broad-spectrum light having a wavelength of 200 to 800 nm in a visible light range.

11. The film thickness measurement device of claim 10, wherein the multilayer film includes a metal film.

12. The film thickness measurement device of claim 11, wherein a film thickness of each film in the multilayer film is in a range of 0.1 to 10 nm.

13. The film thickness measurement device of claim 11, wherein the controller derives the film thickness of the underlayer film together when the optical constant of the underlayer film is derived by spectroscopic interferometry.

14. The film thickness measurement device of claim 11, wherein the controller uses a value obtained from a film formation rate when a film constituting the underlayer film is formed, or a fixed value measured in advance as the film thickness of the underlayer film.

15. The film thickness measurement device of claim 10, wherein the controller derives the film thickness of the underlayer film together when the optical constant of the underlayer film is derived by spectroscopic interferometry.

16. The film thickness measurement device of claim 10, wherein the controller uses a value obtained from a film formation rate when a film constituting the underlayer film is formed, or a fixed value measured in advance as the film thickness of the underlayer film.

17. A film formation system comprising:
a plurality of processing modules configured to form a multilayer film on a substrate;
a transfer module configured to transfer the substrate to the processing modules;
a film thickness measurement device configured to measure a film thickness of a specific film to be measured in the multilayer film in situ; and
a controller,
wherein the film thickness measurement device includes:
a stage on which the substrate is mounted;
a measurement light emission and detection unit including a light emission part configured to emit measurement light for film thickness measurement toward the substrate on the stage and a light receiving sensor configured to receive reflected light due to the measurement light being reflected by the substrate;
a moving mechanism configured to move an irradiation point of the measurement light on the substrate, and
the controller performs:
forming a plurality of films, including a metal film, located under the film to be measured in the processing module;
mounting the substrate, after the plurality of films are formed, on the stage of the film thickness measurement device;
regarding the plurality of films as one underlayer film, measuring a film thickness of the underlayer film, and deriving an optical constant of the underlayer film by spectroscopic interferometry;
forming the film to be measured on the substrate by the processing module; and
mounting the substrate, after the film to be measured is formed, on the stage of the film thickness measurement device, and deriving a film thickness of the film to be measured by spectroscopic interferometry using the film thickness and optical constant of the underlayer film.

18. The film formation system of claim 17, wherein measurement light used in the spectroscopic interferometry is broad-spectrum light having a wavelength of 200 to 800 nm in a visible light range.

19. The film formation system of claim 18, wherein the multilayer film includes a metal film.

20. The film formation system of claim 19, wherein a film thickness of each film in the multilayer film is in a range of 0.1 to 10 nm.

* * * * *